United States Patent [19]

Matsuo et al.

[11] Patent Number: 5,138,423
[45] Date of Patent: Aug. 11, 1992

[54] PROGRAMMABLE DEVICE AND A METHOD OF FABRICATING THE SAME

[75] Inventors: Ichiro Matsuo, Nagaokakyo; Hirotsugu Honda, Takatsuki, both of Japan

[73] Assignee: Matsushita Electronics Corporation, Osaka, Japan

[21] Appl. No.: 649,617

[22] Filed: Feb. 1, 1991

[30] Foreign Application Priority Data

Feb. 6, 1990 [JP] Japan .................................. 2-26522
Feb. 15, 1990 [JP] Japan .................................. 2-35185
Mar. 8, 1990 [JP] Japan .................................. 2-57188

[51] Int. Cl.$^5$ .................... H01L 27/02; H01L 29/04
[52] U.S. Cl. .................................. 357/51; 357/59
[58] Field of Search .................... 357/23.5, 59, 51

[56] References Cited

U.S. PATENT DOCUMENTS 4,757,359 7/1988 Chiao et al. .................... 357/23.5
5,019,532 5/1991 Kaya ................................ 437/186

FOREIGN PATENT DOCUMENTS 62-242336 10/1987 Japan .

Primary Examiner—Mark Prenty
Attorney, Agent, or Firm—Ratner & Prestia

[57] ABSTRACT

A programmable device to which information can be electrically written to, and can store the information, even after power is cut off is disclosed. The programmable device has a lower electrode, an insulating layer formed on the lower electrode, and an upper electrode formed on the insulating layer. The insulating layer has two window regions having a thickness thinner than a region surrounding the window regions. The upper electrode is formed in such a way as to bridge between the two adjacent window regions. The size of programmable regions where the upper electrode overlaps the window regions is made smaller than the minimum feature size defined by resolution of lithography. Further, the total area of the two program regions remains unchanged despite misalignment of masks during the lithography process.

8 Claims, 8 Drawing Sheets

PROGRAMMABLE DEVICE AND A METHOD OF FABRICATING THE SAME

BACKGROUND OF THE INVENTION

1. Field of the Invention

The present invention relates to a programmable device which can be programmed electrically, and more particularly to a programmable device suitable for construction of a semiconductor integrated circuit. And the present invention relates to a method of fabricating such a programmable device.

2. Description of the Prior Art

A programmable read-only-memory (PROM) to which data can be electrically written by the user is extensively used as a semiconductor memory because it can readily provide a read-only-memory (ROM) which contains information (data). For this reason, a programmable logic device (PLD) to which the user can write the desired functions is also used as a logic circuit.

Such PROMs and PLDs consist of small programmable devices which information can be electrically written to, and can store the information even after power is cut off. An example of the prior art programmable device is disclosed in Japanese Laid-Open Patent Publication No. 62-242336.

FIG. 7 shows a planar structure of a prior art programmable device. As shown in FIG. 7, a field insulating film 3 is selectively formed over an isolation region in the main surface of a p-type silicon substrate 1. In the surface region of the silicon substrate 1 over which the field insulating film 3 is not formed, there is formed an n+-diffusion layer that constitutes a lower electrode 2. Also formed on the silicon substrate 1, with the field insulating film 3 interposed therebetween, is an upper electrode 5 formed from a polycrystalline silicon film. The upper electrode 5 is disposed intersecting at right angles with the lower electrode 2. The region (indicated by oblique hatching in FIG. 7) where the lower electrode 2 and the upper electrode 5 overlap each other is a program region 6 of the programmable device. A PROM or a PLD is a circuit consisting of a large number of such programmable devices which are integrated on a single silicon substrate.

FIG. 8 is a cross sectional view taken along line C—C in FIG. 7. As shown in FIG. 8, the upper surface of the lower electrode 2 is covered with a thin program insulating film 7 on top of which the upper electrode 5 is formed. FIG. 9 is a cross sectional view taken along line D—D in FIG. 7. As shown in FIG. 9, while the upper surface of the lower electrode 2 is covered with the program insulating film 7, the surface regions of the silicon substrate 1 where the lower electrode 2 is not formed, are covered with the field insulating film 3. That is, the entire upper surface (main surface) of the silicon substrate 1 is covered with the program insulating film 7 and the field insulating film 3. Thus, the upper electrode 5 is electrically isolated from the silicon substrate 1 by the program insulating film 7 and the field insulating film 3.

In the above programmable device of the prior art, programming, i.e. writing, is performed by applying between the upper electrode 5 and the lower electrode 2 a voltage that is sufficiently higher than the withstanding voltage of the program insulating film 7 and is therefore strong enough to break down the program insulating film 7, thereby accomplishing electrical conduction between the upper electrode 5 and the lower electrode 2.

In the above programmable device, the area of the program region 6 is determined by the respective widths of the upper electrode 5 and the lower electrode 2 as shown in FIG. 7. Because of the need to reduce the wiring resistance, the widths of the upper electrode 5 and the lower electrode 2 cannot be substantially reduced, and generally take two to three times the minimum feature size, which, as a result, prevents the area of the program region 6 from being substantially reduced. In an actual semiconductor integrated circuit (e.g., PROM or PLD), since there are thousands, or tens of thousands of program regions 6, the capacitance, as a whole of unwritten program regions 6, results in a substantially great parasitic capacitance in the semiconductor integrated circuit.

Furthermore, in the above programmable device of the prior art, since the lower electrode 2 is a heavily doped region formed in the semiconductor substrate 1, a large parasitic capacitance is formed between the semiconductor substrate 1 and the lower electrode 2. According to recent semiconductor integrated circuit technology, since the thickness (junction depth) of the heavily doped region constituting the lower electrode 2 is usually thinner (shallower) than 0.3 μm, the lower electrode 2 is inevitably provided with a high sheet resistance of 40 to 50 Ω/□.

Thus, the prior art programmable device has the shortcoming of reducing the operating speed of a semiconductor integrated circuit formed from such devices.

In semiconductor integrated circuits having such programmable devices, polycrystalline silicon is widely used as the material of the electrode (upper electrode 5) because of such advantages as resistance to high temperature heat treatment and excellent adhesion to the surface insulating film. Usually, the electrode in such semiconductor integrated circuits also functions as a line interconnecting between the electrodes of individual programmable devices integrated on the same semiconductor substrate. Therefore, in this specification, the electrode and the line are collectively referred to as the "electrode".

Since a lower resistance is desirable for the electrode, when a polycrystalline silicon film is used to form the electrode, dopant impurities must be added (diffused) into the polycrystalline silicon layer to reduce the resistance thereof. Also, when, for example, an electrode having a laminated structure (polycide structure) comprising a polycrystalline silicon layer and a metal silicide layer is used instead of the above described electrode, dopant impurities are often diffused into the electrode for such purposes as stabilizing the threshold voltage of MISFETs integrated on the same semiconductor substrate as the programmable devices.

A prior art method of diffusing dopant impurities into the electrodes in a semiconductor circuit is described below, with reference to FIGS. 12A to 12D. First, as shown in FIG. 12A, a field oxide film 102 is selectively formed over an isolation region of the main surface of a p-type silicon substrate 101, so that a plurality of regions over which the field oxide film 102 is not formed, are electrically isolated from each other by the field oxide film 102. Next, program insulating films 103 are formed over each of the regions of the silicon substrate 101 over which the field oxide film 102 is not formed. Usually, the thickness of the program insulating films 103 formed over device regions 104 of the silicon substrate 101 is approximately the same as that of the program insulating films 103 formed over scribe line regions 105 thereof.

Next, as shown in FIG. 12B, a polycrystalline silicon film 106 is grown over the program insulating films 103 and the field oxide film 102. Further, as shown in FIG. 12C, arsenic ions of about $1 \times 10^{16}/\text{cm}^2$ are implanted into the polycrystalline silicon film 106 by an ion implantation method.

Thereafter, as shown in FIG. 12D, the polycrystalline silicon film 106 is patterned with a desired geometry by a photoetching technique to form upper electrodes 107.

According to the above fabrication method of the prior art, electrical charges are stored in the polycrystalline silicon film 106 by the implanted ions during the ion implantation process, and the charges are discharged into the substrate 101 through the program insulating films 103 which are thinner than the field oxide film 102. Since the program insulating films 103 are formed to approximately the same thickness regardless of the places where they are formed, the discharge current of the same density flows in any region. This may cause the program insulating films 103 in the device regions 104 to break down, or if not break down, may suffer deterioration in their dielectric strength as a result of injection of the electric charges. Interface levels may also be formed at the interfaces between the program insulating films 103 and the silicon substrate 101. The resulting problem is a drop in reliability of the device having the program insulating films 103.

SUMMARY OF THE INVENTION

The programmable device of this invention, which overcomes the above-discussed and numerous other disadvantages and deficiencies of the prior art, comprises: a first conductive layer, an insulating layer formed on said first conductive layer, and a second conductive layer formed on said insulating layer, wherein said insulating layer has two window regions having a thickness thinner than a region surrounding said window regions, and a region of said insulating layer where said first conductive layer and said second conductive layer overlap each other with said insulating layer interposed therebetween includes a portion of each of said window regions.

In a preferred embodiment, wherein said device further comprises a substrate on which another insulating layer is formed, and said first conductive layer is a conductive layer formed on said another insulating layer.

In a preferred embodiment, wherein said first conductive layer is made of a polycrystalline silicon.

In a preferred embodiment, wherein said first conductive layer comprises a polycrystalline silicon film and a metal silicide film formed on said polycrystalline silicon film.

In a preferred embodiment, wherein said insulating layer comprises a first portion covering the upper surface of said first conductive layer and a second portion covering area of the upper surface of said another insulating layer where said first conductive layer is not formed, and each of said window regions of said insulating layer extends between said first and second portions of said insulating layer.

In a preferred embodiment, wherein said device further comprises a semiconductor substrate, and said first conductive layer is a diffusion layer formed in said semiconductor substrate.

In a preferred embodiment, wherein said insulating layer comprises a first portion covering the upper surface of said first conductive layer and a second portion covering areas of the upper surface of said semiconductor substrate where said first conductive layer is not formed, each of said window regions of said insulating layer extends between said first and second portions of said insulating layer, and said second conductive layer completely covers said window regions of said insulating layer.

In a preferred embodiment, wherein said insulating layer comprises a first portion covering the upper surface of said first conductive layer and a second portion covering areas of the upper surface of said semiconductor substrate where said first conductive layer is not formed, each of said window regions of said insulating layer extends between said first and second portions of said insulating layer, and said second conductive layer partially covers said window regions of said insulating layer.

The method of fabricating a programmable device of this invention, which overcomes the abovediscussed and numerous other disadvantages and deficiencies of the prior art, comprises the steps of: selectively forming a field insulating film over an isolation region of the main surface of a semiconductor substrate; forming a first insulating film over a first region of said main surface of said semiconductor substrate where said field insulating film is not formed; forming a second insulating layer over a second region of said main surface of said semiconductor substrate where said field insulating film is not formed, said second insulating film having a lower dielectric strength than that of said first insulating film, said second insulating film acting as a protective insulating layer; forming a conductive layer at least over said first and second insulating films; and doping said conductive layer with impurities by ion implantation.

According to the invention, a method of fabricating a programmable device is provided, comprising the steps of: selectively forming a field insulating film over an isolation region of the main surface of a semiconductor substrate; forming a second insulating layer over a second region of said main surface of said semiconductor substrate, where said field insulating film is not formed, said second insulating film acting as a protective insulating layer; forming a first insulating film over a first region of said main surface of said semiconductor substrate where said field insulating film is not formed, said first insulating film having a higher dielectric strength than that of said second insulating film; forming a conductive layer at least over said first and second insulating films; and doping said conductive layer with impurities by ion implantation.

According to the invention, a method of fabricating a semiconductor device is provided, comprising the steps of: selectively forming a field insulating film over an insulating region of the main surface of a semiconductor substrate; forming a first insulating film over a first region of said main surface of said semiconductor substrate where said insulating film is not formed, while simultaneously forming a second insulating film over a second region of said main surface of said semiconductor substrate where said isolation region is not formed, said second insulating film having a lower dielectric strength than that of said first insulating film and acting as a protective insulating layer; forming a conductive layer at least over said first and second insulating films;

and doping said conductive layer with impurities by ion implantation.

In a preferred embodiment, wherein said second region is formed within scribe line regions of said semiconductor substrate.

Thus, the present invention described herein makes possible the objectives of:

(1) providing a programmable device in which the area of a program region is made smaller than the limit determined by the minimum feature size attainable in terms of fabrication techniques, thereby reducing the parasitic capacitance of the program region;

(2) providing a programmable device having stable programming characteristics wherein the area of the program region remains unchanged despite misalignment of masks during the lithography process;

(3) providing a programmable device having a fast operating speed, thereby reducing the signal delay time of a semiconductor integrated circuit comprising the programmable device; and (4) providing a method of fabricating a programmable device wherein the thin insulating film constituting the programmable device does not break down, or the electrical characteristics thereof do not deteriorate, by the electrical charges stored therein by ion implantation.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
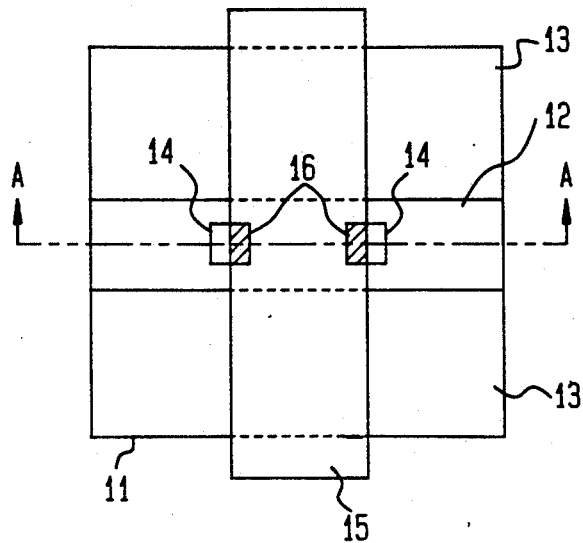
FIG. 1 is a plan view showing a programmable device of a first embodiment of the present invention.

FIG. 1 shows a planar structure of a first embodiment of the present invention In an actual semiconductor integrated circuit (e.g., PROM, PLD, etc.), the programmable device as shown in FIG. 1 is integrated in numerous numbers on the same semiconductor substrate, but in the following description of the present invention, we will deal with a single programmable device for the sake of clarity.

As shown in FIG. 1, a field insulating film 13 is formed over a selected region (isolation region) of a p-type silicon substrate 11, for example, by a conventional LOCOS process. In the surface region of the silicon substrate 11 over which the field insulating film 13 is not formed, there is formed an $n^+$-diffusion layer (2 $\mu$m width) constituting a lower electrode (first conductive layer) 12. The lower electrode 12 is electrically isolated from other diffusion layers (not shown) by the field insulating film 13.

Figure 2:
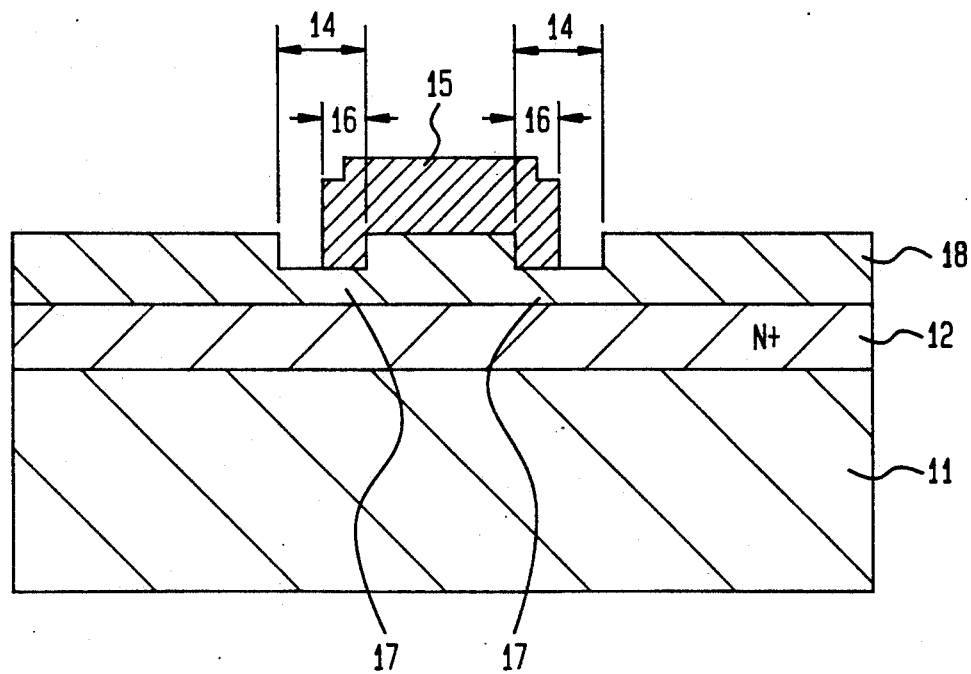
FIG. 2 is a cross sectional view taken along line A—A in FIG. 1.

Formed on the lower electrode 12 is an insulating film 18 (see FIG. 2, not shown in FIG. 1). The insulating film 18 and the field insulating film 13 cover the main surface of the silicon substrate 11. In this specification, the insulating film 18 and the field insulating film 13 are collectively referred to as the "insulating layer". The insulating layer serves to electrically isolate the silicon substrate 11 from an upper electrode 15 hereinafter described. There are formed in portions of the insulating layer (where the programmable device is to be formed) two window regions 14 having a reduced thickness as compared with the surrounding areas. In this embodiment, the window regions 14 are formed within the insulating film 18 (that forms part of the insulating layer). An example in which the window regions 14 are formed extending between the insulating film 18 and the field insulating film 13 is described later as a second embodiment of the invention (see FIG. 3).

The average size of each window region 14 can be as small as the minimum feature size (approx. 1 $\mu$m) that is determined by the resolution of lithography and etching processes. In this embodiment, the size of the window region 14 is 1 $\mu$m. This size can be set according to the width of the lower electrode 12 at an appropriate value smaller than that width. The spacing between the two adjacent window regions 14 is 1 $\mu$m. This spacing can also be set according to the width of the upper electrode 15, which is described below, at an appropriate value smaller than that width.

As shown in FIG. 1, the upper electrode (second conductive layer) 15 formed from a polycrystalline silicon layer (2 $\mu$m width) is formed in such a way as to bridge between the two adjacent window regions 14. The regions indicated by oblique hatching (program regions 16) where the upper electrode 15 overlaps the window regions 14 only need to have an eventual width of about 100 nm (the length of the line of each region 16 shown in FIG. 1, extending in parallel with the line A—A) to serve the purpose. In other words, the width of each program region 16 can be reduced to onehalf to one-third of the minimum feature size if a mask alignment error is considered between the upper electrode 15 and the window regions 14.

FIG. 2 is a cross sectional view taken along line A—A in FIG. 1. As shown in FIG. 2, there is formed on the lower electrode 12 the insulating film 18 about 100 nm in thickness, portions thereof constituting the window regions 14 where the thickness is about 10 nm. The window regions 14 each comprise a programming insulating film 17 which is formed from an oxide film or a laminated film of an oxide film and a nitride film. The thickness of the programming insulation film 17 (for example, about 10 nm) is thin enough to be broken by a voltage of about 15 to 20 Volts. The programming insulating film 17 is formed, for example, by oxidizing the upper surface of the lower electrode 12 using the pyro or dry oxidation process, or by depositing a nitride film using vapor deposition or other method, after the window region 14 of the insulating film 18 has been etched away.

As described above, the regions of the insulating film 18 where the window regions 14 overlap the upper electrode 15 are the program regions 16 According to the above construction, the size of each program region 16 can be made very small, the size along the longitudinal direction of the upper electrode 15 (perpendicular to the line A—A in FIG. 1) being about the same as the minimum feature size and the size along the crosswise direction of the upper electrode 15 (along the direction in parallel with the line A—A FIG. 1) being one-half to one-third of the minimum feature size. As a result, the area of each program region 16 of this embodiment is 0.3 to 0.5 $\mu m^2$, which is one-eighth to one-thirteenth of the area of the programmable region (about 4 $\mu m^2$) in the prior art programmable device.

As is apparent from FIG. 2, the portion of the insulating film 18 where the upper electrode 15 and the lower electrode 12 overlap each other (facing each other) comprises a relatively thin portion constituting the programming insulating film 17 and a relatively thick portion in other areas. The relatively thick portion can be made sufficiently thick as compared to the programming insulating film 17 The provision of this thick portion serves to reduce the capacitance formed between the upper electrode 15 and the lower electrode 12, which in turn serves to reduce the overall parasitic capacitance of the semiconductor integrated circuit formed from this programmable device.

In this embodiment, the window regions 14 are formed on both right and left sides of the region of the insulating film 18 over which the upper electrode 15 is to be formed (see FIG. 1). Therefore, even if a positional deviation occurs between the upper electrode 15 and the window regions 14 due to a mask alignment error during the lithography process for forming the upper electrode 15, the total area of the two program regions 16 remains unchanged, serving to produce stable programming characteristics. To describe in more detail, when the position of the upper electrode 15 is shifted to the left in FIG. 1, the area of the left-side program region 16 will increase, but the area of the right-side program region 16 will decrease by the amount increased. As a result, the combined area of the two program regions 16 remains unchanged regardless of the positional misalignment of the upper electrode 15.

Figure 3:
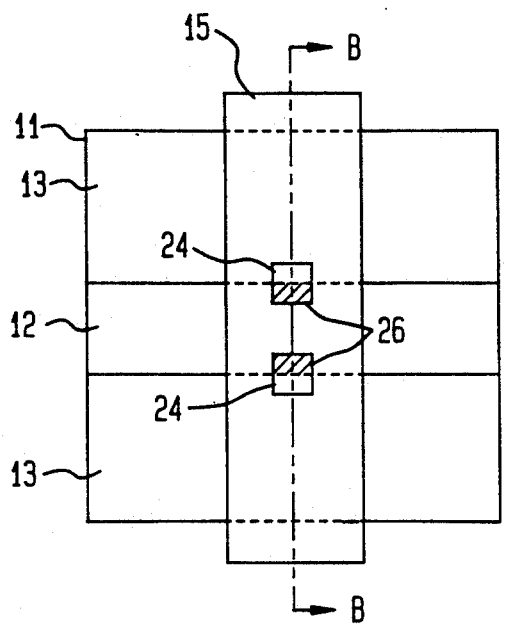
FIG. 3 is a plan view showing a programmable device of a second embodiment of the present invention.
Figure 4:
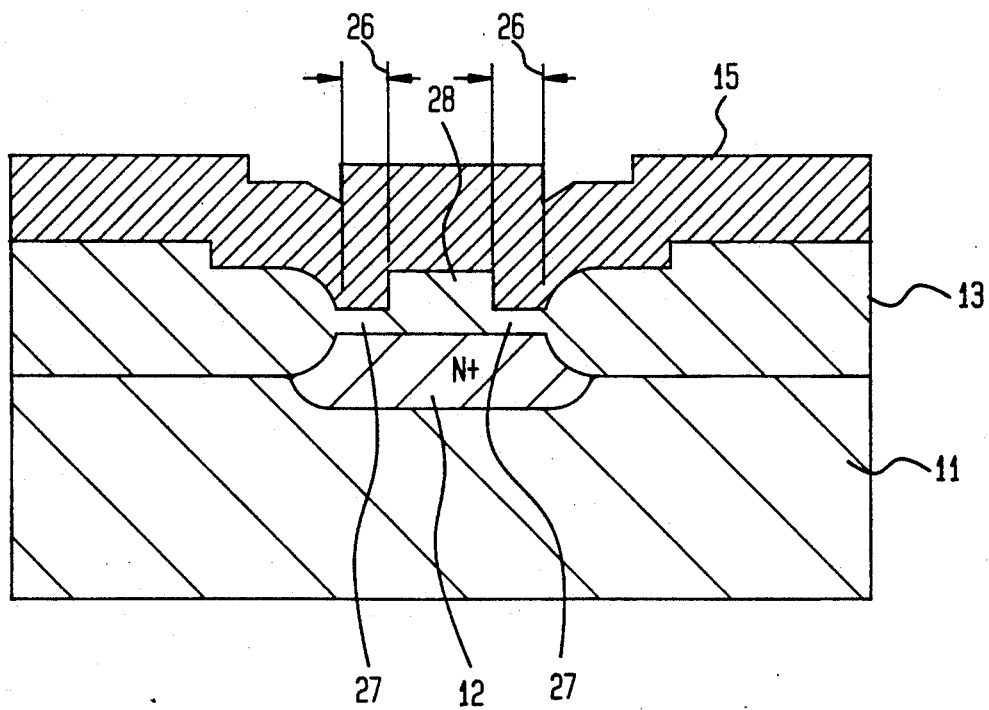
FIG. 4 is a cross sectional view taken along line B—B in FIG. 3.

We will now describe a second embodiment of the present invention with reference to FIGS. 3 and 4. FIG. 3 shows a planar structure of the second embodiment. As shown in FIG. 3, a field insulating film 13 is selectively formed over an isolation region of a p-type silicon substrate 11.

At the surface region of the silicon substrate 11 where the field insulating film 13 is not formed, there is formed an n+-diffusion layer constituting a lower electrode 12. The lower electrode 12 is electrically isolated from other diffusion-layers (not shown) by the field insulating film 13. On the lower electrode 12, an insulating film 28 is formed to a thickness of about 100 nm (see FIG. 4, not shown in FIG. 3). An insulating layer consisting of the insulating film 28 and the field insulating film 13 covers the main surface of the silicon substrate 11.

The insulating layer is provided in portions thereof (where the programmable device is to be formed) with two window regions 24 each having a thickness thinner than a region surrounding the window regions 24. In this embodiment, the window regions 24 are formed extending between the insulating film 28 and the respective field insulating film 13 In other words, each window region 24 extends over one of the two opposing sides of the lower electrode 12 shown in FIG. 3. The average size of each window region 24 can be made as small as the minimum feature size that is determined by the resolution of lithography and etching. In this embodiment, the size of the window region 24 is 1 $\mu m$. This size can be set according to the width of the upper electrode 15 at an appropriate value smaller than that width. The spacing between the two adjacent window regions 24 is 1 $\mu m$. This spacing can also be set according to the width of the lower electrode 12 at an appropriate value smaller than that width.

The thickness of the portions of the insulating film 28 where the window regions 24 are formed is 10 nm, which is thinner than the other portions of the insulating film 28 (thickness of about 100 nm). The portions of the window regions 24 which are superposed over the lower electrode 12 constitute program regions 26 (regions indicated by oblique hatching in FIG. 3). The eventual width of each program region 26 which is determined by the window region 24 and the lower electrode 12 (the length of the line of the program region 26 extending parallel with the line B—B in FIG. 3) should be about 100 nm or so to serve the purpose. Even if a mask alignment error is considered between the window regions 24 and the lower electrode 12, the width should usually come within the range of one-half to one-third of the minimum feature size. The upper electrode 15 (2 $\mu m$ width) made of polycrystalline silicon is formed to cover completely the two adjacent program regions 26 as shown in FIG. 3.

FIG. 4 is a cross sectional view taken along line B—B in FIG. 3. As shown in FIG. 4, most of the upper surface of the lower electrode 12 is covered with the thick insulating film 28, about 100 nm in thickness, but the portions thereof where the lower electrode 12 overlaps the window regions 24 are covered with a thin program insulating film 27 about 10 nm in thickness. (The program insulating film 27 constitutes the program region 26 of the insulating layer.)

According to this embodiment, the size of each program region 26 can be made very small, the size along the direction in parallel with the upper electrode 15 (parallel with the line B—B) being one-half to one-third of the minimum feature size. As a result, the area of each program region 26 of this embodiment is 0.3 to 0.5 $\mu m^2$, which is one-eighth to one-thirteenth of the area of the programmable region (about 4 $\mu m^2$) in the prior art programmable device.

Since the thickness of the insulating film 28 where the upper electrode 15 and the lower electrode 12 overlap each other in other portions thereof than where the program regions 26 are formed can be made sufficiently thick as compared with the thickness of the program insulating films 27, the capacitance formed between upper electrode 15 and the lower electrode 12 can be reduced, which in turn serves to reduce the overall parasitic capacitance of the semiconductor integrated circuit comprising the programmable device.

Also, in this embodiment, the window regions 24 are formed on both sides of the region of the insulating film 28 where the lower electrode 12 is formed (see FIG. 3). Therefore, even if a positional difference occurs between the window regions 24 and the lower electrode 12 due to a mask alignment error during the lithography process for forming the window regions 24, the total area of the two program regions 26 remains unchanged, serving to produce stable programming characteristics at all times. To describe in more detail, when the position of the window regions 24 is shifted upward in FIG. 3, the area of the upper program region 26 will decrease, but the area of the lower program region 26 will increase by the amount decreased. As a result, the combined area of the two program regions 26 remains unchanged regardless of the positional misalignment of the window regions 24.

Figure 5:
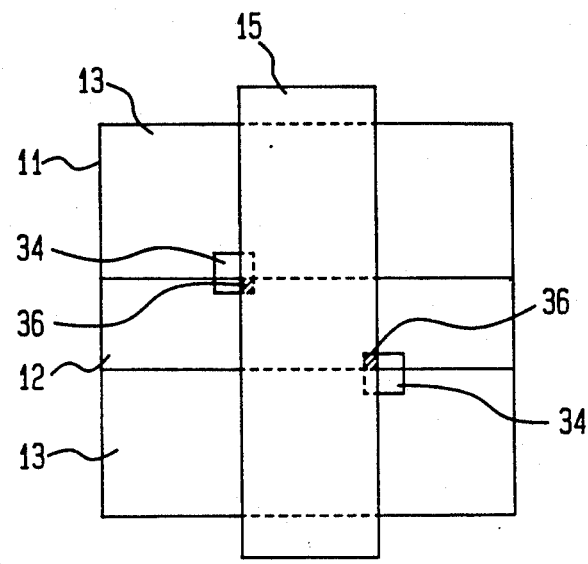
FIG. 5 is a plan view showing a programmable device of a third embodiment of the present invention.

FIG. 5 shows a third embodiment of the present invention having the construction that can further enhance the advantage of the present invention. As illustrated in FIG. 5, the construction of this embodiment is different from those of the foregoing embodiments in the positions of window regions 34; otherwise, they are identical in construction. The following description therefore only deals with the window regions 34 to explain this embodiment.

In this embodiment, each window region 34 is disposed extending between the insulting film (not shown in FIG. 5) on the lower electrode 12 and the field insulating film 13. In other words, each window region 24 is disposed extending over one of the two opposing sides of the lower electrode 12 shown in FIG. 5, while at the same time extending over one of the two opposing sides of the upper electrode 15.

According to this construction, the shape of each program region 36 indicated by oblique hatching in FIG. 5 is determined by the region where the lower electrode 12, the window region 34, and the upper electrode 15 overlap each other. Since the width of the portion where the window region 34 and the upper electrode 15 overlap each other can be reduced to about one-half to one-third of the minimum feature size as in the foregoing embodiments, the area of the program regions 36 is consequently reduced to 0.1 to 0.25 $\mu m^2$, which is one-sixteenth to one-fortieth of the area of the programmable region (about 4 $\mu m^2$) in the prior art programmable device, thus further enhancing the effect of reducing the parasitic capacitance.

Also, according to this construction, even if a positional difference occurs between the window regions 34 and the lower electrode 12 due to a mask alignment error during the lithography process for forming the window regions 34, the total area of the two program regions 36 remains unchanged. Further, even if a positional difference occurs between the upper electrode 15 and the window regions 34 due to a mask alignment error during the lithography process for forming the upper electrode 15, the total area of the two program regions 36 remains unchanged. Accordingly, the programmable device of this embodiment provides further stable programming characteristics as compared with the first and second embodiments.

Figure 6:
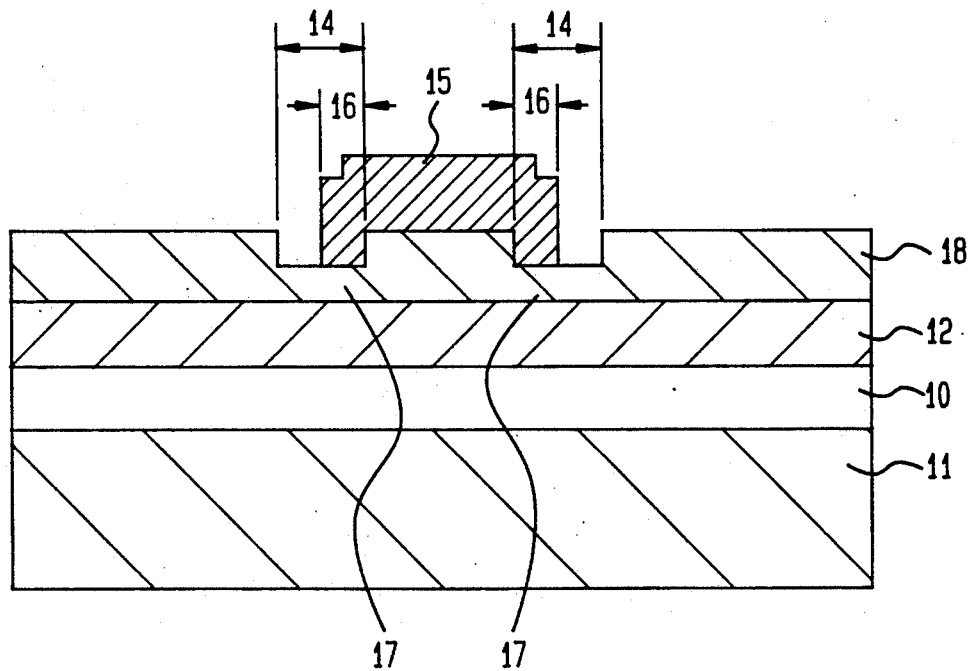
FIG. 6 is a cross sectional view showing a programmable device of a fourth embodiment of the present invention.
Figure 7:
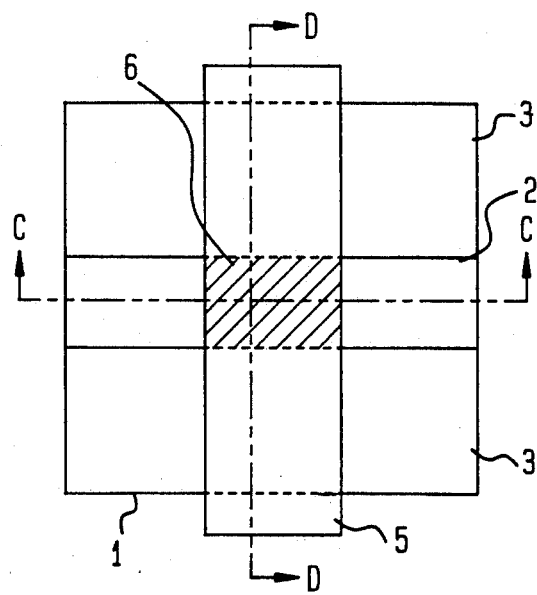
FIG. 7 is a plan view showing a prior art example.
Figure 8:
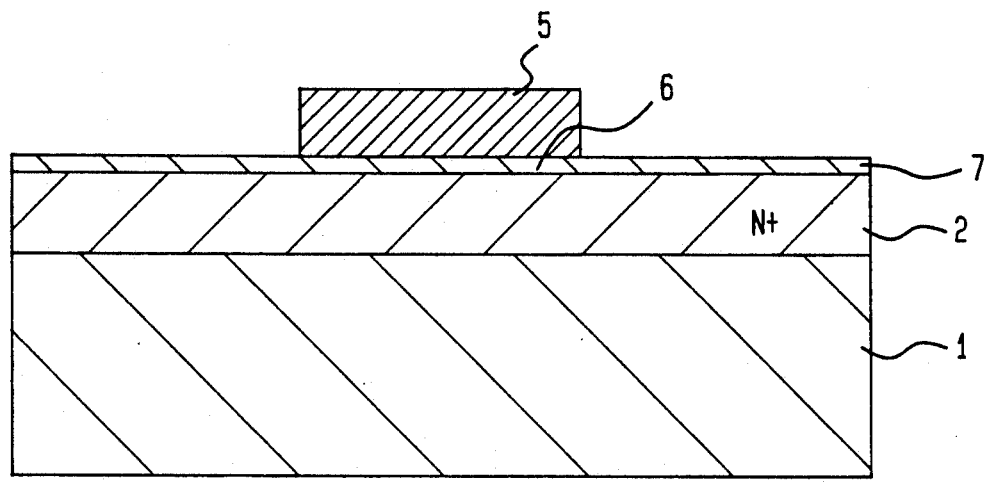
FIG. 8 is a cross sectional view taken along line C—C in FIG. 7.
Figure 9:
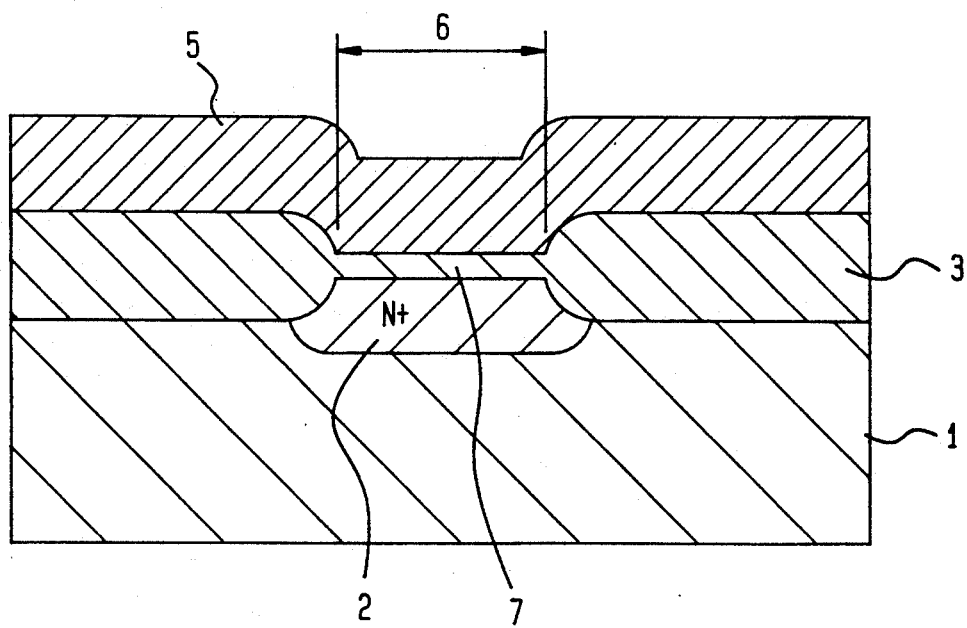
FIG. 9 is a cross sectional view taken along line D—D in FIG. 7.

In any of the first, second, and third embodiments, the lower electrode 12 of the programmable device is a diffusion layer formed in the silicon substrate 11 The following describes an example (a fourth embodiment) in which the lower electrode 12 is not a diffusion layer FIG. 6 is a cross sectional view of a programmable device of the fourth embodiment of the present invention. The planar structure of this embodiment is essentially the same as that of the first embodiment (see FIG. 1).

As illustrated in FIG. 6, a field insulating film 10 having a sufficient thickness (for example, thickness of about 500 nm) is formed on a semiconductor substrate 11. On the field insulating film 10, there is formed a lower electrode 12 formed from polycrystalline silicon. The lower electrode 12 is not limited to a single layer structure, but may have a laminated layers structure (polycide structure) consisting of a polycrystalline silicon layer and a metal silicide layer formed thereon.

When the lower electrode 12 is formed from a polycrystalline silicon layer about 400 nm in thickness formed for example by the low pressure chemical vapor deposition method (LPCVD method), the lower electrode 12 will be provided with a sheet resistance of about 20 $\Omega/\square$ by heavily doping the polycrystalline silicon layer with dopant impurities. On the other hand, when the lower electrode 12 has a polycide structure consisting of a polycrystalline silicon layer about 200 nm in thickness formed for example by a LPCVD method and a tungsten silicide about 150 nm in thickness formed thereon, the lower electrode 12 will have a sheet resistance of about 5 $\Omega/\square$. In either case, the lower electrode 12 of this embodiment has a lower sheet resistance than the sheet resistance (40 to 50 $\Omega/\square$) of the prior art lower electrode formed from a heavily doped region.

Most of the upper surface of the lower electrode 12 is covered with an insulating film 18 having a sufficient thickness (e.g., about 120 nm) that can withstand the application of a program voltage of about 15 to 20 volts. The areas of the insulating film 18 positioned over designated areas of the upper surface of the lower electrode 12 constitute window regions where the thickness is reduced. The window regions 14 are formed from a programming insulating film 17 consisting of an oxide film or a laminated film of an oxide film and a nitride film. The thickness of the programming insulating film 17 is thin enough to be broken by a voltage of about 15 to 20 volts (for example, a thickness of about 10 nm). The programming insulating film 17 is formed, for example, by oxidizing the upper surface of the lower electrode 12 using the pyro or dry oxidation process, or by depositing a nitride film over the lower electrode 12 using the vapor deposition or other method.

An upper electrode 15 (second conductive layer) formed from polycrystalline silicon is formed on the insulating film 18 in such a manner as to cover a portion of each window region 14 of the insulating film 18. The portion of each window region 14 of the insulating film 18 covered by the upper electrode 15 functions as a programmable region 16.

In the programmable device of this embodiment, since the field oxide film 10 has a sufficient thickness of 500 nm, the parasitic capacitance formed between the lower electrode 12 and the semiconductor substrate 11 is sufficiently reduced as compared to the parasitic capacitance in the programmable device of the first embodiment of the present invention or of the prior art. Also, as described above, the sheet resistance of the lower electrode 12 is lower than that of the lower electrode 2 of the prior art. Particularly, in the case of the lower electrode 12 having a polycide structure, a considerable reduction in the resistance is achieved.

For these reasons, a semiconductor integrated circuit in which the programmable device of this embodiment is integrated in numerous numbers on a single semiconductor substrate has shorter signal delay time and therefore can operate at a higher speed.

Since it has two window regions 14 as in the first embodiment, the programmable device of this embodiment combines the excellent advantages offered in the first embodiment with the above enumerated advantages.

As described, according to the programmable device of the present invention, since the area of the program region formed from a thin insulating film can be made smaller than the limit determined by the minimum feature size attainable in terms of fabrication techniques, the parasitic capacitance of the program region is reduced. Also, since the area of the program region remains unchanged despite a mask alignment error, the characteristics of the programmable device are less likely to vary.

Furthermore, in one preferred embodiment of the present invention, the parasitic capacitance between the lower electrode and the semiconductor substrate can be sufficiently reduced by isolating the lower electrode from the semiconductor substrate by a field insulating film having a sufficient thickness. According to this embodiment, since a low-resistance material can be used for the lower electrode, the sheet resistance of the lower electrode can be made sufficiently lower than that of the lower electrode formed from a heavily doped region in the semiconductor substrate.

It will be appreciated that the sizes (film thicknesses) and materials of the elements constituting the programmable device of the present invention and the methods of forming the elements are not limited to those described above.

When fabricating the programmable device of the present invention having thin insulating films as the programming insulating films 17 and 27, there is a possibility, during the process of implanting ions into the conductive film forming the upper electrode 15, that the thin insulating films may be broken down by the electrical charges stored in the conductive film. Referring to FIGS. 10A to 10D, we will now describe a method of programmable device fabrication in which destruction of the insulating films is prevented.

Figure 10A:
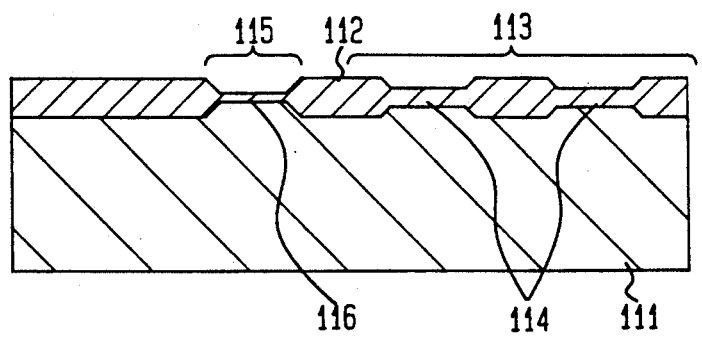
FIGS. 10A through 10D show a cross section of a semiconductor device at major processing stages in the method of programmable device fabrication according to the present invention.

First, as shown in FIG. 10A, a field oxide film 112 is formed by selectively oxidizing an insolation region of the main surface of a p-type semiconductor substrate 111. The field oxide film 112 may be formed by other methods than the above-mentioned localized oxidation method, for example, by depositing oxide film (or other insulating film) and by patterning the field oxide film (or patterning the insulating film).

The areas of the main surface of the semiconductor substrate 111 over which the field oxide film 112 is not formed are electrically isolated from each other by the field oxide film 112. Program insulating films 114 are formed over the areas (first region) of the main surface of the semiconductor substrate 111 over which the field oxide film 112 are not formed and which are positioned in a device region 113 of the semiconductor substrate 111.

On the other hand, a protective insulating film 116 which has a lower dielectric strength than the program insulating film 114 is formed over the area (second region) over which the field oxide film 112 is not formed and which is positioned in a protective region 115. The thickness of the protective insulating film 116 should be made thinner than that of the program insulating film 114 so that the protective insulating film 116 has a lower dielectric breakdown voltage than the program insulating film 114. For example, when the thickness of the program insulating film 114 is 20 nm, the thickness of the protective insulating film 116 should be 10 to 15 nm.

In the region (first region) within the semiconductor substrate 111 under the program insulating films 114, there are formed lower electrodes formed from diffusion layers, although not shown in FIG. 10A. The diffusion layers are formed prior to the formation of the program insulating films 113.

The protective insulating film 116 is formed, for example, by oxidizing the upper surface of the protective region 115 or by other methods, after selectively removing a thin insulating film (not shown) formed over the protective region 115 when the program insulating films 114 were formed over the first region of the semiconductor substrate 111.

The process for forming the program insulating films 114 may be performed either before or after the process for forming the protective insulating film 116. It is also possible to perform these processes simultaneously. When simultaneously oxidizing the first and second regions of the semiconductor substrate 111 if the oxidation rate of the first region is controlled at a higher level than that of the second region, the program insulating films 114 and the thinner protective insulating film 116 can be obtained simultaneously. To differentiate the oxidation rate between the first and second regions of the semiconductor substrate 111 as mentioned above, the first region of the semiconductor substrate 111 should be provided with a higher impurity concentration than the second region thereof. Since the heavily doped diffusion layers (functioning as the lower electrodes) are formed in the first region of the semiconductor substrate 111 as described above, the impurity concentration of the first region of the semiconductor substrate 111 can be easily made higher than that of the second region thereof by not forming such heavily doped diffusion layers in the second region. Thus, the program insulating films 114 and the protective insulating film 116 can be easily formed simultaneously by a single oxidation process. This method has the advantage of reducing the number of fabrication steps since it does not require a special process for forming the protective film 116.

Figure 10B:
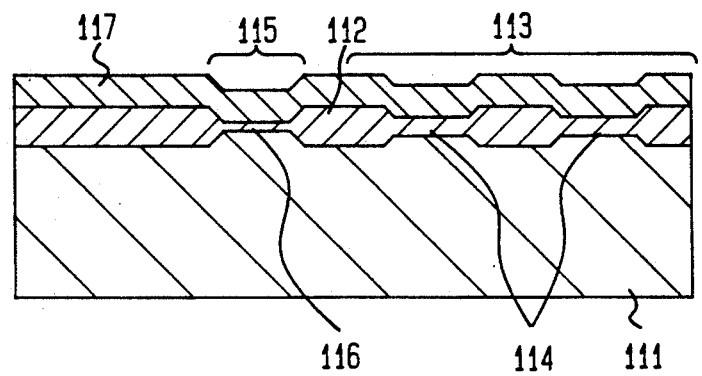

Next, as shown in FIG. 10B, a polycrystalline silicon film 117 is formed to cover the field oxide film 112, the program insulating films 114, and the protective insulating film 116, over the entire surface of the substrate 111.

Thereafter, dopant impurities are introduced into the polycrystalline silicon film 117, by thermal treatment in phosphorous oxychloride ($POCl_3$) ambient, or by other method, to confer conductivity on the polycrystalline silicon film 117. The dopant impurities should only be added in an amount sufficient to confer conductivity on the polycrystalline silicon film 117, and a higher doping level is not required. Also, uniformity in the distribution of impurity concentration through the film is not an essential factor.

Figure 10C:
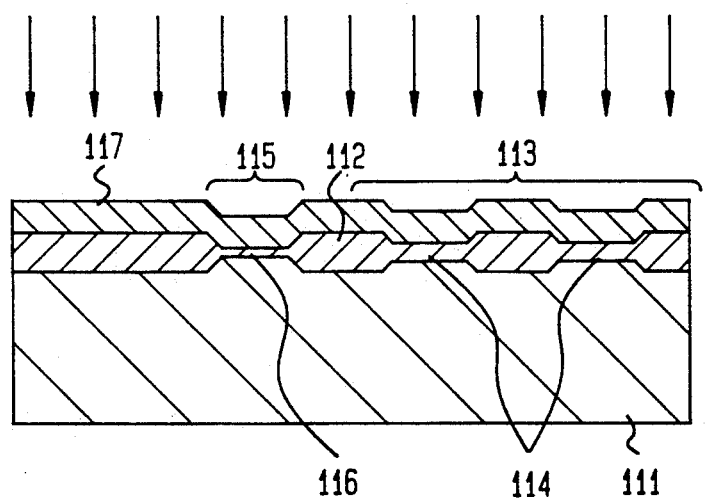

Next, as shown in FIG. 10C, the polycrystalline silicon film 117 is doped with arsenic ions of approximately $10^{16}/cm^2$ using an ion implantation method. During this process, most of the electrical charges stored in the polycrystalline silicon film 117 by the implantation of arsenic ions are discharged into the substrate 111 through the relatively thin protective insulating film 116. This is because the protective region 115 that forms a part of the main surface of the substrate 111 is not doped with impurities of the opposite conductivity type to that of the substrate 111 and is electrically connected to the semiconductor substrate 111.

During the ion implantation, the electrical potential of the polycrystalline silicon film 117 with respect to the substrate 111 is fixed to an level approximately equal to the dielectric breakdown voltage of the protective insulating film 116. As a result, hardly any current flows through the program insulating films 114 which are thicker than the protective insulating film 116 and which therefore have a higher breakdown voltage.

Figure 10D:
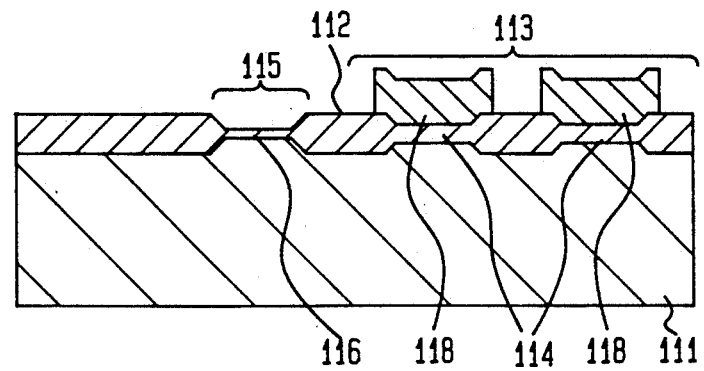

Next, as shown in FIG. 10D, the polycrystalline silicon film 117 is patterned with a desired geometry by photoetching to form an upper electrode 118. At this time, the polycrystalline silicon film over the protective region 115 is removed, as shown in FIG. 10D, or if it is not removed, the polycrystalline silicon film is isolated from the upper electrode 118. This prevents the operation of the device from being affected in case the protective insulating film 116 is destroyed or deteriorates.

Referring to FIGS. 11A to 11D, we will now describe another fabrication method of the present invention in which the protective region is formed in scribe line regions.

Figure 11A:
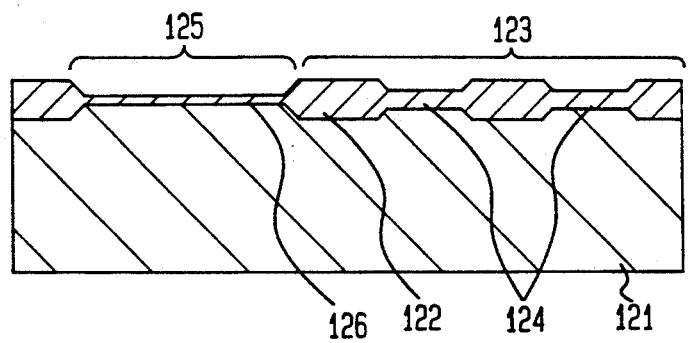
FIGS. 11A through 11D show a cross section of a semiconductor device at major processing stages in another method of programmable device fabrication according to the present invention.

First, as shown in FIG. 11A, a field oxide film 122 is formed by selectively oxidizing isolation regions of the main surface of a p-type semiconductor substrate 121. The remaining area on the main surface of the semiconductor substrate 121 over which the field oxide film 122 is not formed is partitioned into a plurality of regions by the field oxide film 122. Program insulating films 124 are formed over the areas (first region) of the semiconductor substrate 121 over which the field oxide film 122 is not formed and which are positioned within a device region 123 of the semiconductor substrate 121.

On the other hand, a protective insulating film 126 which is thinner than the program insulating films 124 is formed over the area (second region) of the semiconductor substrate 121 over which the field oxide film 122 is not formed and which is positioned within a scribe line region 125 of the semiconductor substrate 112. The scribe line region 125 of the semiconductor substrate 121 is not specifically doped with impurities of the opposite conductivity type to that of the semiconductor substrate 121. As a result, the scribe line region 125 is electrically connected to the inside of the semiconductor substrate 121.

Figure 11B:
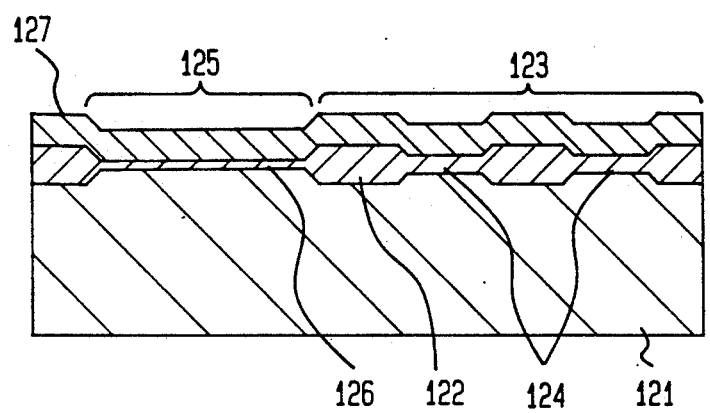

Next, as shown in FIG. 11B, a polycrystalline silicon film 127 is formed covering the field oxide film 122, the program insulating films 124, and the protective insulating film 126, over the entire surface of the semiconductor substrate 121, and is doped with impurities by thermal diffusion to confer conductivity on the polycrystalline silicon film 127.

Figure 11C:
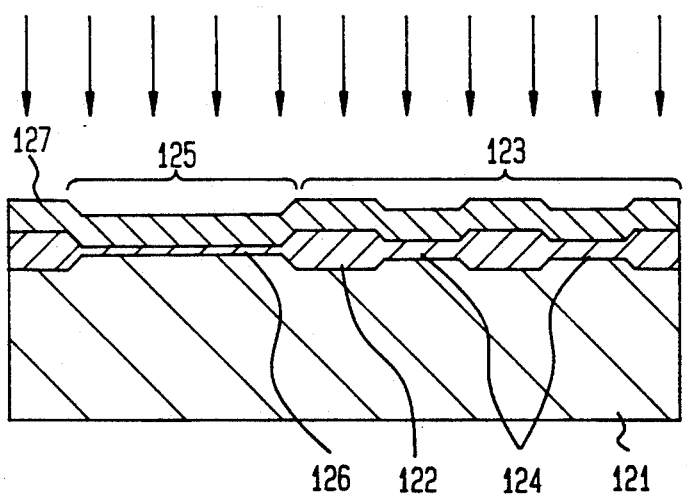
Figure 11D:
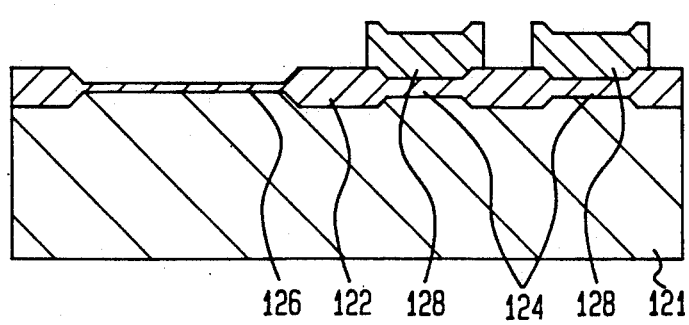
Figure 12A:
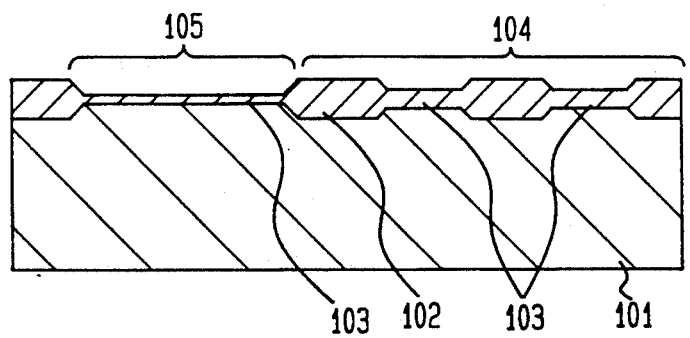
FIGS. 12A through 12D show a cross section of a semiconductor device at major processing stages in a prior art method of programmable device fabrication.
Figure 12B:
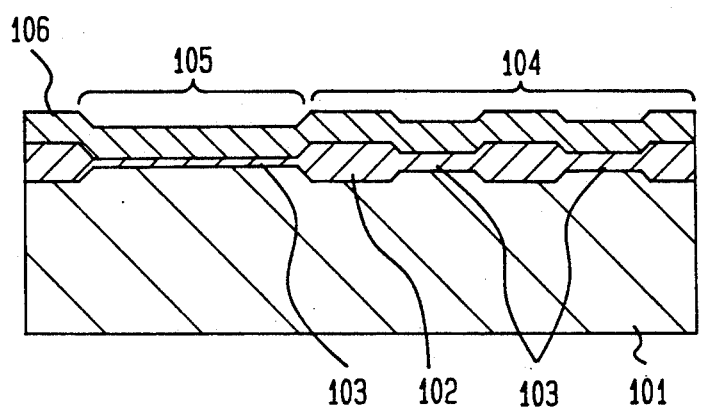
Figure 12C:
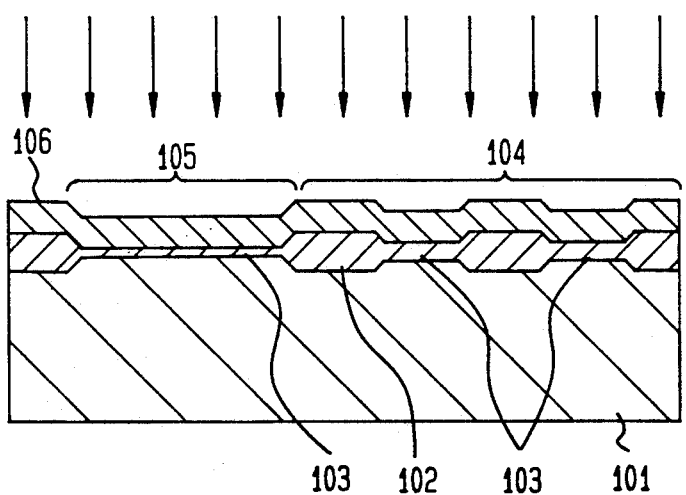
Figure 12D:
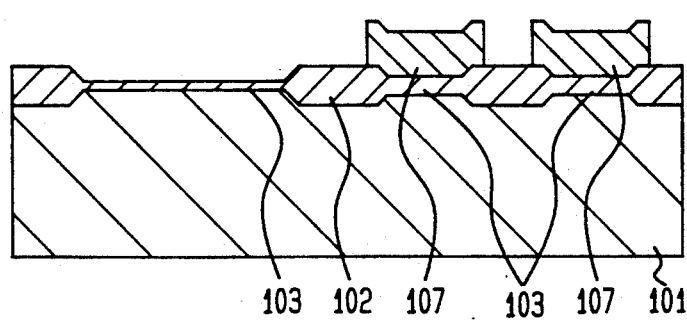

Thereafter, as shown in FIG. 11C, the polycrystalline silicon film 127 is doped with arsenic ions of approximately $10^{16}/cm^2$ using an ion implantation technique. Next, as shown in FIG. 11D, the polycrystalline silicon film 127 is patterned with a desired geometry by photoetching or other method, to form an upper electrode 128.

In this embodiment, since the protective insulating film 126 is formed over the scribe line region 125 of the semiconductor substrate 121, there is no need to provide a special region on the semiconductor substrate 121 in order to form a protective region.

For convenience of explanation, the above description has dealt with an example in which the entire scribe line region 125 of the semiconductor substrate 121 is used as the protective region, but it will be appreciated that sufficient effects can be obtained even if only part of the scribe line region is used as the protective region.

In both of the above embodiments, neither the protective region 115 nor the scribe line region 125 of the semiconductor substrates 111 and 121 is specifically doped with impurities, but these regions may be highly doped with impurities of the same conductivity type as that of the substrates 111 and 121.

In order for the protective insulating films 116 and 126 to have a lower dielectric breakdown voltage than the program insulating films 114 and 124, a different film material may be used for the protective insulating films 116 and 126 instead of reducing the film thickness thereof. For example, an oxide film may be used for the protective insulating films 116 and 126, while a composite film (multilayer film) consisting of an oxide film and a nitride film is used for the program insulating films 114 and 124 Generally, when an oxide film is compared with a composite film consisting of an oxide film and a nitride film, the latter has a higher withstanding voltage than the former when both are of the same thickness.

In both of the above embodiments, a polycrystalline silicon layer is used to form the upper electrodes 118 and 128, the polycrystalline silicon being given conductivity by thermal diffusion, but other materials which have conductivity in themselves (for example, tungsten, molybdenum, titanium, tantalum, silicides of these metals, aluminum, aluminum alloy, etc.) may be used for the upper electrodes 118 and 128. Also, when a polycrystalline silicon layer is used for the upper electrodes 118 and 128, impurities may be introduced into the polycrystalline silicon layer while it is being grown by vapor phase reaction. It will also be appreciated that impurity atoms (ions) introduced by ion implantation into the conductive film, which forms the upper electrodes 118 and 128, and the dose, etc. are not limited to the kind and value given in the description of the above embodiments.

As described above, according to the method of programmable device fabrication of the present invention, the charges stored by ion implantation in the conductive electrode film on the insulating film flow only into the protective region of the semiconductor substrate, not into the thin insulating films constituting the programmable device. This prevents breakdown and deterioration of the thin insulating films constituting the programmable device and thereby provides the programmable device with high reliability. Furthermore, when the protective region is provided within the scribe line regions, it is possible to obtain the same excellent effects without requiring an extra area for formation of the protective region.

The method of programmable device fabrication as described above can also be applied to the fabrication of a semiconductor device (for example, a MISFET) having thin insulating films (such as gate insulating films) susceptible to dielectric breakdown.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A programmable device comprising a first conductive layer, an insulating layer formed on said first conductive layer, and a second conductive layer formed on said insulating layer, wherein said insulating layer has two window regions having a thickness thinner than a region surrounding said window regions, and a region of said insulating layer where said first conductive layer and said second conductive layer overlap each other with said insulating layer interposed therebetween includes a portion of each of said window regions.

2. A programmable device according to claim 1, wherein said device further comprises a substrate on which another insulating layer is formed, and said first conductive layer is a conductive layer formed on said another insulating layer.

3. A programmable device according to claim 2, wherein said first conductive layer is made of a polycrystalline silicon film.

4. A programmable device according to claim 2, wherein said first conductive layer comprises a polycrystalline silicon film and a metal silicide film formed on said polycrystalline silicon film.

5. A programmable device according to claim 2, wherein said insulating layer comprises a first portion covering the upper surface of said first conductive layer and a second portion covering areas of the upper surface of said another insulating layer where said first conductive layer is not formed; and each of said window regions of said insulating layer extends between said first and second portions of said insulating layer.

6. A programmable device according to claim 1, wherein said device further comprises a semiconductor substrate, and said first conductive layer is a diffusion layer formed in said semiconductor substrate.

7. A programmable device according to claim 6, wherein said insulating layer comprises a first portion covering the upper surface of said first conductive layer and a second portion covering areas of the upper surface of said semiconductor substrate where said first conductive layer is not formed, each of said window regions of said insulating layer extends between said first and second portions of said insulating layer, and said second conductive layer completely covers said window regions of said insulating layer.

8. A programmable device according to claim 6, wherein said insulating layer comprises a first portion covering the upper surface of said first conductive layer and a second portion covering areas of the upper surface of said semiconductor substrate where said first conductive layer is not formed, each of said window regions of said insulating layer extends between said first and second portions of said insulating layer, and said second conductive layer partially covers said window regions of said insulating layer.

* * * * *